United States Patent [19]

Eaglesham et al.

[11] Patent Number: 5,169,798

[45] Date of Patent: Dec. 8, 1992

[54] FORMING A SEMICONDUCTOR LAYER USING MOLECULAR BEAM EPITAXY

[75] Inventors: David J. Eaglesham, Hoboken; Hans-Joachim L. Gossmann, Summit, both of N.J.

[73] Assignee: AT&T Bell Laboratories, Murray Hill, N.J.

[21] Appl. No.: 546,128

[22] Filed: Jun. 28, 1990

[51] Int. Cl.$^5$ .................. H01L 21/20; H01L 21/203
[52] U.S. Cl. ............................ 437/81; 437/82; 437/105; 437/106; 437/107; 437/108; 437/110; 437/126; 437/247; 148/33; 148/33.4; 156/611; 156/613; 156/614
[58] Field of Search .............. 148/DIG. 3, DIG. 4, 148/25, 41, 58, 71, 97, 129, 155, 169, 33, 33.1, 33.3, 33.4; 156/610-614; 427/248.1, 255.1; 437/81, 82, 105, 106, 108, 110, 111, 112, 126, 132, 247, 173, 971, 107

[56] References Cited

U.S. PATENT DOCUMENTS

| | | | |
|---|---|---|---|
| 4,774,205 | 9/1988 | Choi et al. | 437/132 |
| 4,806,502 | 2/1989 | Jorke et al. | 437/106 |
| 4,835,116 | 5/1989 | Lee et al. | 437/111 |
| 4,843,028 | 6/1989 | Herzog et al. | 437/106 |
| 4,952,527 | 8/1990 | Calawa et al. | 437/132 |

OTHER PUBLICATIONS

Nishi et al., "Growth of Single Domain GaAs on 2-inch Si (100) . . . ", Jpn. J. Appl. Phys., vol. 24, No. 6, Jun. 1985, pp. L391-L393.

Chang et al., "Growth of High Quality GaAs Layers Directly on Si . . . ", J. Vac. Sci. Technol., B5 (3), May/Jun. 1987, pp. 815-818.

"Kinetics of Ordered Growth of Si on Si(100) at Low Temperatures", by H. Jorke et al., Phys. Rev. B, vol. 40, 1989.

"Low Temperature Kinetics of Si(100) MBE Growth", by H. Jorke et al., Thin Solid Films, 183(1989), pp. 307-313.

"Properties of Si Layers Grown by Molecular Beam Epitaxy at Very Low Temperatures", by H. Jorke et al., Applied Physics Letters, 54(9), Feb. 27, 1989, pp. 819-821.

"Gallium Doping of Silicon Molecular Beam Epitaxial Layers at Low Temperatures and Under Si+ Ion Bombardment", by F. Schaffler et al., Thin Solid Films, 184 (1990), pp. 75-83.

"Picosecond GaAs-based Photoconductive Optoelectronic Detectors", by F. W. Smith et al., Applied Physics Letters, 54 (10), Mar. 6, 1989, pp. 890-892.

"New MBE Buffer for Micron and Quarter-Micron Gate GaAs MESFET's", by F. W. Smith et al., 1987 IEEE, pp. 229-233.

"Growth and Characterization of Atomic Layer Doping Structures in Si", by A. A. Van Gorkum et al., Journal of Applied Physics, 65 (6), Mar. 15, 1989, pp. 2485-2492.

"Atomic Layer Doped Field-Effect Transistor Fabricated using Si Molecular Beam Epitaxy", by K. Nakagawa et al., Applied Physics Letters, 54 (19), May 8, 1989, pp. 1869-1871.

(List continued on next page.)

Primary Examiner—Robert Kunemund
Assistant Examiner—Ourmazd S. Ojan
Attorney, Agent, or Firm—E. E. Pacher

[57] ABSTRACT

Disclosed is a method of making a semiconductor device that comprises MBE at substrate temperatures substantially lower than conventionally used temperatures. A significant aspect of the method is the ability to produce highly doped (e.g., $10^{19} cm^{-3}$) epitaxial single crystal Si layers. The deposition can be carried out such that substantially all (at least 90%) dopant atoms are electrically active at 20° C. However, the method is not limited to Si MBE. Exemplarily, the method can be used to produce epitaxial single crystal GaAs having very short (e.g., <100ps) carrier lifetime. Such material can be useful for, e.g., high speed photodetectors. Incorporation into the method of a relatively low temperature rapid thermal anneal makes possible low temperature MBE growth of relatively thick semiconductor layers.

8 Claims, 3 Drawing Sheets

OTHER PUBLICATIONS

"Silicon Molecular Beam Epitaxy", by Y. Shiraki, *Journal of Vacuum Science & Technology B*, vol. 3, No. 2, Mar. 1985, pp. 725–729.

"Electrical Properties of Si(100) Films Doped with Low-Energy (<150 eV)Sb Ions During Growth by Molecular Beam Epitaxy", by P. Fons et al., Applied Physics Letters, vol. 53, No. 18, Oct. 31, 1988, pp. 1732–1734.

"Very Low Temperature Growth and Doping of Silicon MBE Layers", by H. Jorke et al., *Journal of Crystal Growth*, vol. 95, No. 1–4, Feb. 1989, Amsterdam NL, pp. 484–485.

"Reduction of Dislocation Density of MBE-Grown $Si_{1-x}Ge_x$ Layers on (100) Si by Rapid Thermal Annealing", by B. Hollander et al., *Thin Solid Films*, vol. 183, No. 1, Dec. 30, 1989, Lausanne CH, pp. 157–164.

"Low Temperature Surface Cleaning of Silicon and Its Application to Silicon MBE", by A. Ishizaka et al., *Journal of the Electrochemical Society*, vol. 133, No. 4, Apr. 1986, Manchester, N.H., U.S., pp. 666–671.

"P-Type Delta Doping in Silicon MBE", by N. L. Mattey et al., *Thin Solid Films*, vol. 184, No. 1, Jan. 1990, Lausanne CH, pp. 15–90.

"Sn Incorporation in GaAs by Molecular Beam Epitaxy", by H. Ito et al., Japanese Journal of Applied Physics, Part 2: Letters, vol. 26, No. 11, Nov. 1987, Tokyo JP, pp. 1760–1762.

"Heavily Si–Doped GaAs and AlAs/n-GaAs Superlattice Grown by Molecular Beam Epitaxy", by M. Ogawa et al., *Japanese Journal of Applied Physics*, vol. 24, No. 8, Aug. 1985, Tokyo JP, pp. 572–574.

FORMING A SEMICONDUCTOR LAYER USING MOLECULAR BEAM EPITAXY

FIELD OF THE INVENTION

This invention pertains to methods of making semiconductor devices that involve epitaxial growth of a semiconductor layer on a semiconductor substrate.

BACKGROUND OF THE INVENTION

Essentially all currently used methods of producing Si-based semiconductor devices involve the epitaxial growth of single crystal Si on a single crystal substrate, typically a Si substrate. A variety of growth methods are known. Among these is molecular beam epitaxy (MBE), which involves exposing, in a vacuum chamber, a substrate to a flux of one or more atomic or molecular species, the flux of a given species originating from a source, exemplarily comprising a quantity of molten Si. However, though MBE is finding use in making compound semiconductor devices, to date it has not found significant use for making Si-based devices. This is at least in part due to the so-called "doping problem" in Si MBE.

In contrast to other known methods of epitaxial material growth (e.g., CVD), MBE does not inherently require high substrate temperatures. However, it has generally been believed that single crystal epitaxial Si of more than a few monolayer thickness can only be grown by MBE if the substrate temperature $T_s$ is at or above a temperature $T_{epi} \sim 300°$ C. Typically, commercially significant growth conditions involve $T_s$ of at least about 450° C. As is well known to those skilled in the art, prior art MBE techniques have generally been unable to produce Si with electrically active dopant concentrations above about $10^{18}$ cm$^{-3}$, due at least in part to surface segregation of the dopant atoms on the Si substrate surface. This is the above referred to doping problem. On the other hand, it would be highly desirable to be able to produce by MBE device-grade epitaxial Si doped to levels above $10^{18}$ or even $10^{19}$ cm$^{-3}$, since such highly doped Si is of considerable interest, e.g., for high speed bipolar transistors.

H. Jorke et al., *Physical Review B*, Vol. 40, pp. 2005-2008 (1989) report a growth rate dependence of the minimum temperature for epitaxial growth of Si by MBE. For instance, at the (quite low) deposition rate of 0.1 nm/s, films of thickness 1 μm were found to be single crystalline if $T_s$ was in the range 870-590K, to contain increasing densities of cone-like defects for $T_s$ in the range 590-500K, and to be amorphous below 500K (227° C.). These workers proposed the existence of a "maximum epitaxy width $\Delta E$" that depends both on the deposition rate and the substrate temperature, and defines the maximum thickness of an epitaxial Si layer that can be grown at a given rate and temperature. In H. Jorke et al., *Thin Solid Films*, Vol. 183, pp. 307-313 (1989), the cone-like defects are described as being " . . . accompanied by a large number of (111) and ($\bar{1}\bar{1}$1) oriented smaller scale defects which can be identified as twins . . . ". Thus it is evident that Si layers with cone-like defects are not single crystal layers, and generally will not be acceptable for device manufacture.

The possibility of growing single crystal epitaxial Si at low substrate temperatures, exemplarily ≲350° C. or even 300° C., is of substantial interest for semiconductor device manufacture. For instance, H. Jorke et al., *Applied Physics Letters*, Vol. 54(9), pp. 819-821 (1989), list the following three advantages of a low growth temperature:

i) increased overall compatibility with additional processes required for the fabrication of electronic devices;

ii) reduced tendencies for three-dimensional growth and intermixing processes in heterostructure growth; and iii) reduction of surface segregation, observed at common growth temperatures for the majority of dopants, due to kinetic limitations.

In the first mentioned paper by Jorke et al. the authors also point out that growth at low temperature" . . . offers very promising feasibilities to construct atomic-scale Sb distributions in silicon MBE films." Low temperature growth also offers the potential of relatively abrupt dopant profiles, a feature that will be of increasing importance as smaller and smaller design rules are used.

The potential advantages of low temperature MBE growth are not limited to Si but would at least to some extent also be present in III-V compound semiconductors such as GaAs and InP.

In the second-mentioned Jorke et al. paper it is reported that homogeneously Sb-doped, 0.1 μm thick epitaxial Si layers were grown with $T_s$ in the range 250°-350° C., with maximum Sb concentrations of $10^{18}$ cm$^{-3}$ achieved. However, it is reported that only a small fraction (e.g., 17% in layers grown at 250° C., 23% in layers grown at 300° C.) of the Sb atoms were electrically active at room temperature. This result is ascribed to the existence of a " . . . Sb impurity complex which is similar to the SiAs$_4$ cluster . . . ". Those skilled in the art know that it is the density of electrically active (i.e., ionized) dopant atoms that is of device significance, and that the presence of a significant fraction of un-ionized dopant atoms is highly undesirable, since un-ionized dopant atoms cause excess scattering without contributing to the carrier density.

In the Jorke et al. paper in *Applied Physics Letters* it is reported that a monolayer ($10^{15}$ cm$^{-2}$) of Sb was deposited on (100) Si with a 0.1 μm not intentionally doped Si cap layer deposited thereon at $T_s$ in the range 200°-350° C. The lowest temperature is said to have resulted in an amorphous cap layer, with $T_s \geq 250°$ C. said to have resulted in crystalline Si. The fraction of electrically active dopant atoms at room temperature is reported to decrease with decreasing deposition temperature $T_s$, being 0.81 for $T_s = 350°$ C., and about 0.45 for $T_s = 200°$ C.

F. Schäffler et al, *Thin Solid Films*, Vol. 184, pp. 75-83 (1990) report on Ga doping of Si MBE epitaxial layers at relatively low temperatures (550°-300° C.). These workers apparently were attempting to produce a step-function doping profile and found that, for $T_s \lesssim 400°$ C., the Ga concentration in the Si layer is highly non-uniform. For instance, for $T_s = 350°$ C., a growth rate of 0.25 nm/s, and a constant Ga flux of $3.5 \times 10^{10}$/cm$^2$.s, the Ga concentration was found to increase roughly linearly with time for about the first 400s (0.1 μm layer thickness) to about $2 \times 10^{16}$ cm$^{-3}$, followed by an almost exponential increase, reaching a peak of about $4 \times 10^{18}$ cm$^{-3}$ at about 0.35 μm, with the concentration thereafter decreasing to about $1.5 \times 10^{18}$ cm$^{-3}$ at the top surface of the 0.5 μm thick layer. For $T_s = 300°$ C. the behavior was even more non-linear, with the peak concentration of about $3 \times 10^{18}$ cm$^{-3}$ reached at about 0.1 μm, dropping to about $1.5 \times 10^{18}$ cm$^{-3}$ at about 0.25 μm, and remaining at this level thereafter, indicating that all arriving Ga atoms are incorporated into the lattice within the growth of one monolayer. As those skilled in the art know, unintentionally highly non-uniform dopant concentrations are generally undesirable.

F. Schäffler et al. (ibid) state that flat doping (i.e., Ga) profiles " . . . can be achieved by creating an adequate dopant layer before growth commences (pre-build-up), and keep (sic) it constant during growth by replenishing the desorption and incorporation losses." However, the results presented do not support the proposition that pre-build-up results in a flat doping profile (see, for instance FIG. 2 of the reference).

A known method of producing a doped epitaxial Si layer on a Si substrate is solid phase epitaxy (SPE). This method typically involves depositing a dopant layer on a Si surface, followed by deposition of an amorphous Si layer thereon, and heating the combination such that the amorphous layer becomes transformed into a crystalline layer. See, for instance, A. A. van Gorkum et al., *Journal of Applied Physics*, Vol 56(6), pages 2485–2492, and K. Nakagawa et al., *Applied Physics Letters*, Vol. 54(19), pages 1869–1871.

SPE is alleged to be able to produce relatively highly doped ($10^{19}$ cm$^3$ and even higher) Si. However, the dopant atoms generally are not electrically active, and the method typically requires activation of the dopants by means of a high temperature (typically >700° C.) heat treatment. Due to this high temperature step the method is not well suited to producing sharp dopant profiles. By a "sharp" profile we mean a profile in which the transition from 10% to 90% of the maximum dopant concentration occurs within at most 10 nm.

The prior art also knows examples of MBE growth of GaAs at temperatures substantially below the customary temperatures. For instance, F. W. Smith et al., *Applied Physics Letters*, Vol. 54(10), pp. 890–892, disclose growth of crystalline material, nominally GaAs, by MBE at 200° C. The material was said to be highly non-stoichiometric (composition $Ga_{0.99}As_{1.01}$). In a subsequent publication (*Picosecond Electronics and Optoelectronics III*, D. M. Bloom and T. C. L. G. Sollner, editors, OSA Washington 1989) the authors give more detail, including the fact that the as-deposited material has a lattice constant larger than the GaAs lattice constant, and had relatively low resistivity. After annealing at 600° C. for 10 minutes the lattice constant was the same as the GaAs lattice constant, and the material had high resistivity.

In view of the above referred-to advantages of epitaxial growth at relatively low substrate temperatures, it would be very desirable to have available a low temperature MBE growth technique that is capable of producing (doped or undoped) single crystal epitaxial semiconductor layers of thickness greater than a limiting thickness for epitaxial growth ($h_{epi}$). Furthermore, it would be very desirable to have available a MBE growth technique that can be used to produce highly doped single crystal epitaxial Si and other semiconductor layers, with very sharp doping profiles, including very narrow δ-doping profiles, and with substantially all of the dopant atoms being electrically active at room temperature. This application discloses such a method.

SUMMARY OF THE INVENTION

In a broad aspect the invention is a method of making an article that comprises a semiconductor device, the method comprising growing an epitaxial (doped or not intentionally doped) single crystal semiconductor layer at a substrate temperature $T_s$ substantially lower than commonly used prior art substrate temperatures. In another broad aspect the invention is a method of making a semiconductor device that comprises growing highly doped epitaxial single crystal semiconductor material, preferably Si, with relatively abrupt dopant profile, and/or having a previously unattainable concentration of activated dopant atoms.

An exemplary embodiment of the invention comprises providing a single crystal semiconductor body having a major surface, maintaining the body at a given temperature $T_s$ and exposing the major surface to a stream of at least one atomic or molecular species such that a single crystal epitaxial semiconductor layer is formed at a given rate on at least a part of the surface. Significantly, $T_s$ is less than 400, 350 or even 300° C., and the semiconductor layer has a thickness that is less than or equal to a thickness $h_{epi}$ that is associated with the given $T_s$. Exemplarily the stream consists, during all of the time required to deposit the layer, of a single species (e.g., Si) or of two or more species (e.g. Si and In), such that, respectively, a not intentionally doped or a uniformly doped layer results. Alternatively, the stream can consist initially of a single species (e.g., Si), followed for a short period by a different single species (e.g., Ga) stream, which in turn is followed by a stream of the initial single species, such that a δ-doped layer results. Of course, other sequences are also possible, as will be evident to those skilled in the art. For instance, the final portion of the growth sequence could involve exposure to a two-species stream (e.g., Si and Sb), such that a p-n junction results.

In particular embodiments of the invention the semiconductor body is a Si body, or a III-V compound semiconductor body (e.g., GaAs, InSb, AlGaAs, InGaAsP) and the method further comprises subjecting, after formation of the semiconductor layer with thickness $\leq h_{epi}$, the body with the epitaxial layer thereon to a rapid thermal anneal (RTA), and forming on the first epitaxial semiconductor layer a second single crystal epitaxial layer of thickness $\leq h_{epi}$. This process of deposition and RTA can be repeated until the desired deposit thickness is attained. The maximum temperature ($T_a$) and time ($t_a$) at $T_a$ of the RTA, as well as the heating and cooling rates associated with the RTA, are selected such that essentially no bulk diffusion and/or strain relaxation occurs, and such that a significant amount of surface diffusion can occur. Exemplarily, $450 \leq T_a \leq 600°$ C., $t_a < 60s$, and the heating rate and cooling rate are such that the transitions between $T_s$ and $T_a$ are substantially completed in at most 60 s. Compound semiconductor material (e.g. GaAs) produced according to the invention is advantageously used in, e.g., fast photodetectors, since the mobile charge carriers in thus produced material typically have relatively short lifetimes, ($\lesssim 100$ ps, even 10 ps).

In a still further particular embodiment of the invention the semiconductor body is a Si body, $T_s \lesssim 350°$ C., the epitaxial layer (of thickness $\leq h_{epi}$) comprises doped Si formed by exposing the major surface of the body to a particle stream comprising, at least at some time during the formation of the epitaxial layer, both Si and a dopant species selected from the group consisting of Sb, Ga, In, B, As and P. The ratio of Si to dopant species is selected such that the maximum dopant concentration in the doped portion of the deposited material is at least $10^{18}$ or even $10^{19}$ cm$^{-3}$. Significantly, we have discovered that the deposition can be carried out such that substantially all (more than 50%, preferably more than 85%, even 90%) of the dopant atoms in the epitaxial layer are electrically active at room temperature (20° C.), without need for a post-growth high temperature (>750° C.) activation step.

According to the invention, highly doped (dopant concentration > $10^{18}$ cm$^{-3}$) epitaxial Si layers of arbitrary thickness can be formed by a process analogous to the above described multistep process, but with the composition of the particle stream adjusted such that Si with the required dopant concentration is deposited. Since bulk diffusion rates of all commercially useful dopants in Si are quite low at conventionally used $T_a$, very sharp dopant profiles can be produced by means of the inventive technique. Furthermore, thin ($\leq h_{epi}$), highly doped ($\geq 10^{19}$ cm$^{-3}$), layers of epitaxial Si can be grown, with the dopant atoms being substantially fully (>90%) activated at room temperature. Such layers can be overlain by an epitaxial Si layer of opposite conductivity type. Substrates with such a layer structure thereon can be processed to yield devices (e.g., bipolar transistors) having previously unattainable characteristics. Exemplarily, such devices have a relatively thin (e.g., $\leq 50$ nm) base that is highly doped (e.g., with Ga, In, Sb, B, As, or P) to a level $\geq 10^{19}$ cm$^{-3}$, with at least 90% of the dopant atoms being electrically active at room temperature.

As will be appreciated by those skilled in the art, subsequent to the low temperature growth step according to the invention, conventional processing can be resumed, such that the desired article (e.g., IC) results. Exemplary of conventional processing steps are further MBE growth at temperatures above about 450° C., implantation, photolithography, etching, metalization, and packaging.

DETAILED DESCRIPTION OF SOME PREFERRED EMBODIMENTS

As those skilled in the art know, one of the major problems in MBE, significantly impeding its application to device manufacture, is the difficulty of incorporation and control of dopants. This is particularly true for Si, especially for the common dopants Ga, In, Sb, As or P, but also, to a somewhat lesser extent, for the p-type dopant B. The MBE growth of Si on Si(100) is customarily carried out at $T_s$ of at least about 450° C. At these temperatures dopant incorporation in Si is governed by segregation. It is known that segregation can be avoided for $T_s \lesssim 400°$ C. However, as discussed above, prior art results indicate that typically only an unacceptably small fraction of the dopant atoms is electrically active if $T_s \lesssim 400°$ C.

Contrary to the prior art results, we have discovered that relatively highly doped ($\gtrsim 10^{18}$, $5 \times 10^{18}$ or even $10^{19}$ cm$^{-3}$) single crystal epitaxial Si can be produced by MBE, with substantially all of the dopant atoms being electrically active.

Figure 1:
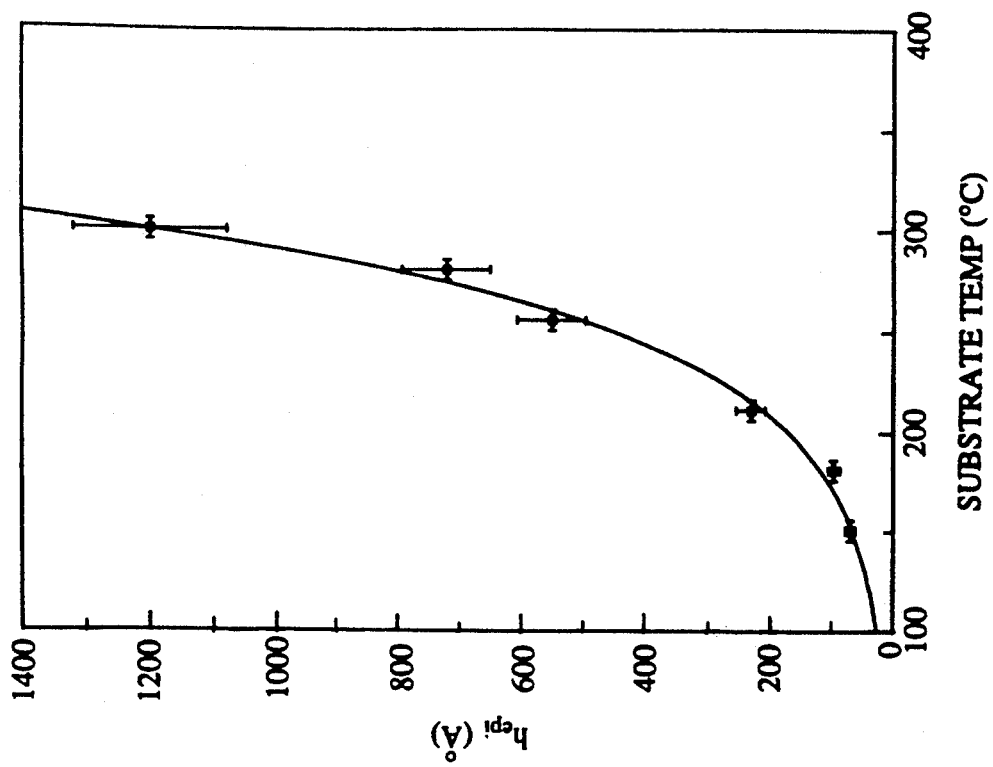
FIG. 1 gives exemplary data on the limiting epitaxial thickness ($h_{epi}$) of Si as a function of substrate temperature ($T_s$)

FIG. 1 shows exemplary data on the limiting epitaxial thickness ($h_{epi}$) of Si as a function of temperature, for a deposition rate of 0.07 nm/sec. The results are similar for other deposition rates, and those skilled in the art can readily obtain the data for any desired deposition rate. The data of FIG. 1 was obtained from a sequence of layers, grown as follows: in a vacuum chamber (pressure $\lesssim 10^{-9}$ Torr) a (100) Si wafer was annealed at 900° C. to remove oxide, a Si buffer layer was grown at 850° C. and 0.07 nm/s, a 0.8 nm thick Ge-containing marker layer was grown at 580° C. and 0.01 nm/s, followed by the low temperature growth of 150 nm of Si. Identical results are obtained if the marker layer is absent.

Figure 2:
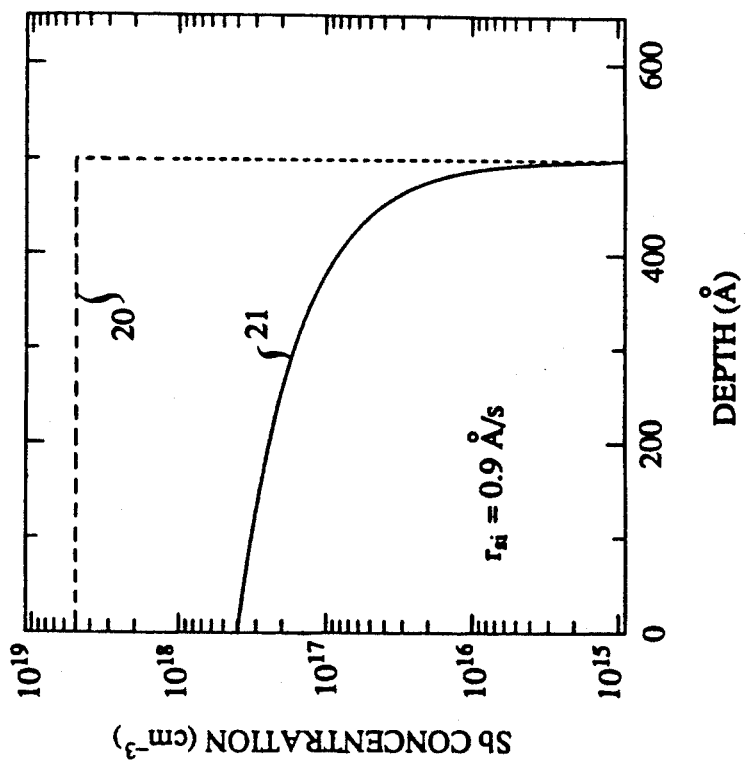
FIG. 2 depicts a dopant profile resulting from a prior art deposition method.

FIG. 2 shows an exemplary calculated Sb concentration profile in a prior art MBE deposited Si layer. It is assumed that a 50 nm thick film is grown on Si(100) at 460° C., a temperature near the lower bound of typical prior art MBE growth temperatures. Furthermore, a Si deposition rate of 0.0192 nm/s and a Sb flux of $1.93 \times 10^{-6}$ nm/s is assumed. These fluxes would result in a Sb concentration of $5.0 \times 10^{18}$ cm$^{-3}$ for unity Sb sticking coefficient and incorporation probability. This "nominal" profile is shown as dashed line 20 in FIG. 2. However, the actual sticking coefficient and incorporation probability at 460° C. are far from unity. Following a known treatment (H. Jorke, *Surface Science*, Vol. 193, p. 569), the actual dopant profile (solid line 21 of FIG. 2) was obtained. As can be seen immediately, the prior art MBE deposition results in a Sb profile that is far from ideal, with a maximum concentration more than two orders of magnitude below the target value, and significant smearing.

In MBE apparatus of the type used to grow the Si layers of FIG. 1 we grew doped epitaxial Si as follows: 1000 Ωcm p-type Si(100) substrates were chemically cleaned in conventional fashion, a protective oxide layer was grown, the oxide was desorbed by the known Si-beam cleaning technique at a temperature of 800° C. and a Si flux of $1.6 \times 10^{13}$/cm$^2$·s for a total of 1.5 nm, and a 20 nm Si buffer layer grown at 300° C., followed by an anneal at 900° C. Subsequently the substrate surface was exposed to a flux of Si and Sb, such that a doped Si layer of thickness less than $h_{epi}$ results.

Figure 3:
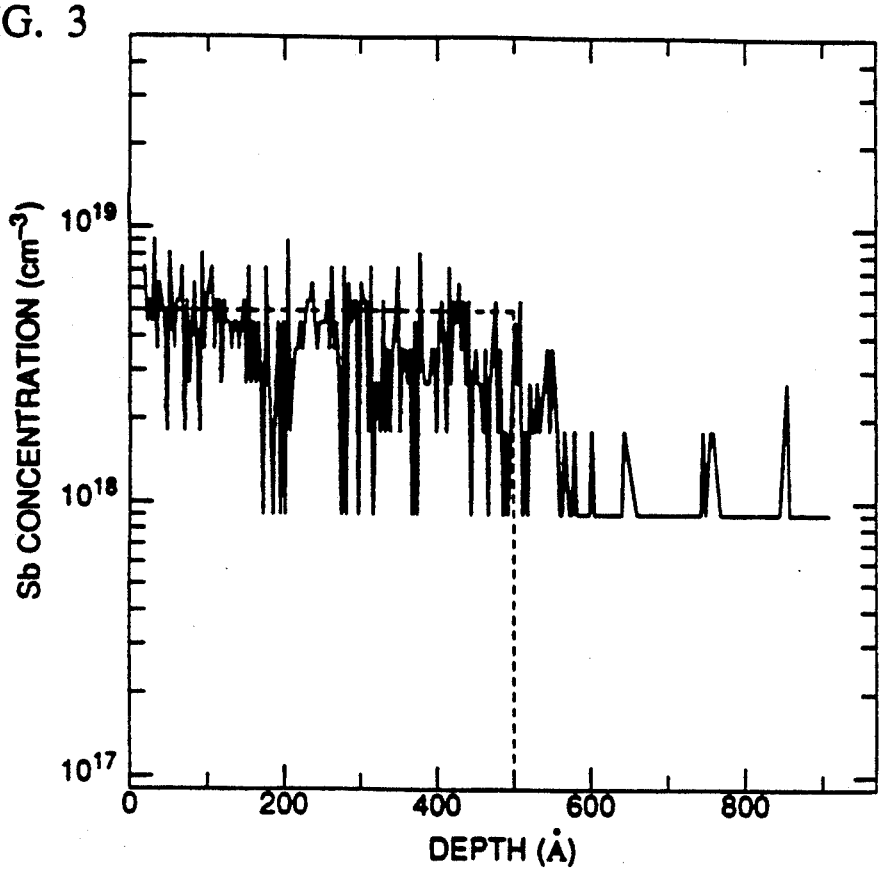
FIG. 3 presents exemplary data on the dopant distribution in a Si layer produced according to the invention.

FIG. 3 shows a SIMS profile (3.0 KeV Cs+) of a 50 nm thick Sb-doped Si film, grown by MBE at 350° C. on a 1000 Ω.cm p-type Si(100) substrate that was prepared as described above. The Si and Sb fluxes were as assumed for FIG. 2, resulting in a nominal Sb concentration of $5 \times 10^{18}$ cm$^{-3}$. As can be seen from FIG. 3, intended and actual dopant concentration agree within experimental error.

As was discussed above, for device applications it is highly desirable that the room temperature carrier concentration in a doped region be substantially the same as the dopant atom concentration. In other words, it is highly desirable that substantially all dopant atoms be activated at room temperature.

Figure 4:
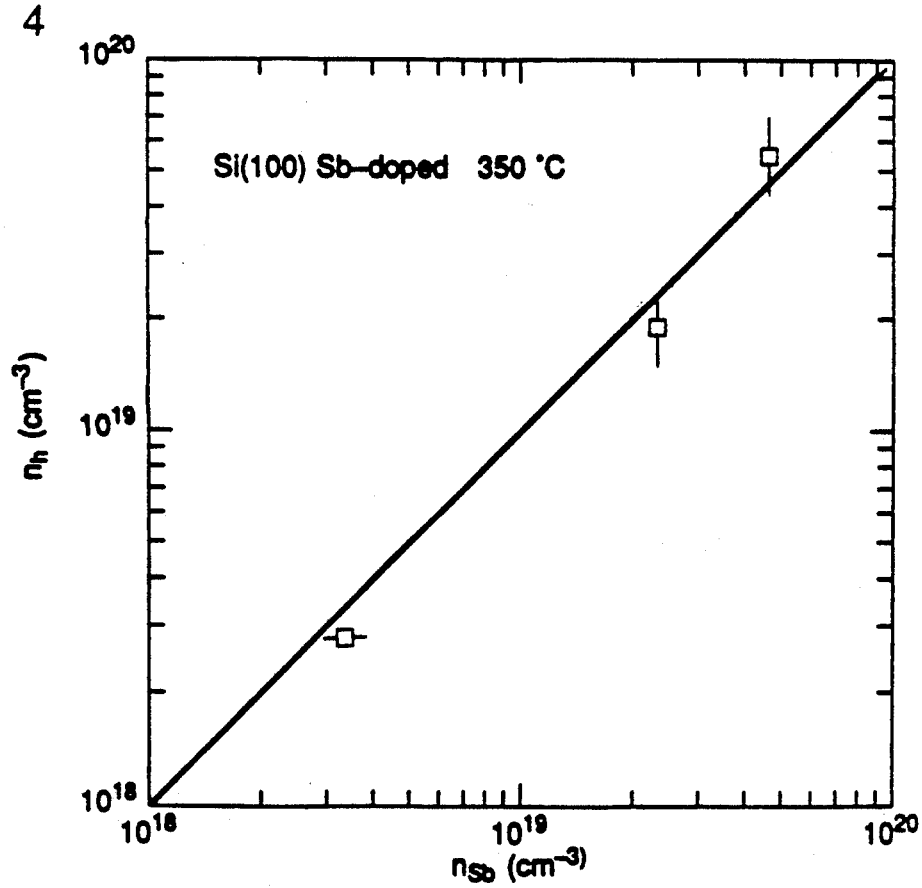
FIG. 4 shows data on the electron density versus the dopant concentration in material produced according to the invention.

FIG. 4 shows exemplary data on the Hall concentration of n-type carriers in 50 nm thick Sb-doped Si films, ($T_s = 350°$ C.) measured in the van der Pauw geometry at room temperature, as a function of the Sb concentration measured by SIMS and ion scattering. The measured data was corrected for the surface depletion width. The correction is insignificant at concentrations above about $10^{19} cm^{-3}$. The solid line of FIG. 4 indicates 100% activation. This is indeed achieved within experimental error. As those skilled in the art will recognize, our results indicate incorporation of Sb into Si at levels significantly above the solid solubility limit at 350° C. (estimated to be about $7 \times 10^{18} cm^{-3}$).

Figure 5:
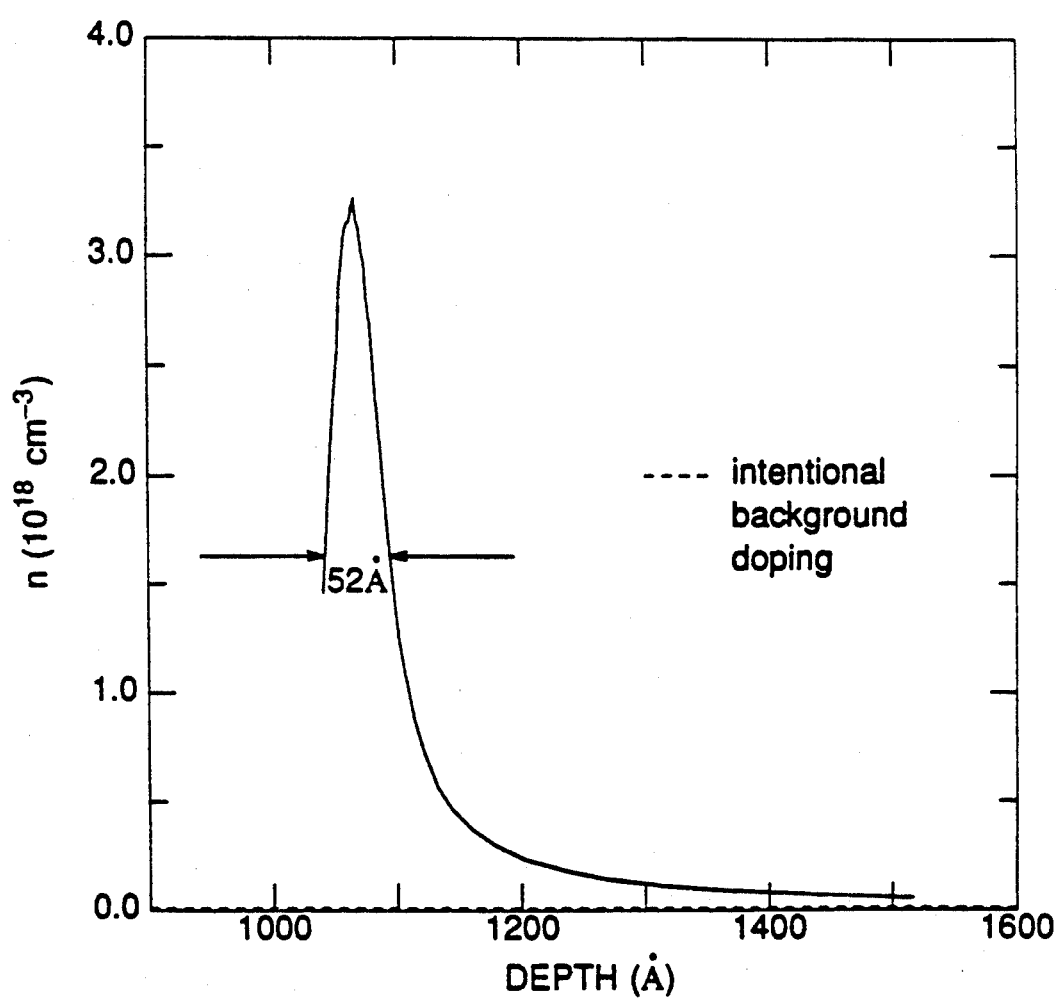
FIG. 5 presents exemplary data on dopant concentration as a function of depth in a δ-doped layer of Si produced according to the invention.

The inventive method is not limited to producing uniformly doped layers but can also be used to produce very narrow dopant distributions, as exemplified by FIG. 5. The figure pertains to a sample that comprises a 200 nm thick slightly n-type ($1 \times 10^{16} cm^{-3}$) MBE-grown ($T_s = 350°$ C.) layer of Si on a 0.01 $\Omega$cm n-type Si substrate. A $\delta$-doped layer of nominally $4 \times 10^{12}$ Sb/cm² was embedded within the MBE-grown Si layer. Capacitance-voltage (CV) measurements at 2 MHz were used to generate the data presented in FIG. 5, indicating a (measurement limited) full width at half maximum of 5.2 nm. In order to achieve substantially fully activated $\delta$-doping profiles in Si, $T_s$ in the range 250°–400° C., even 300°–350° C., are currently preferred.

The inventive method is not only applicable to the MBE growth of Si but can, using substantially similar conditions, be applied to the growth of compound semiconductors, exemplarily III-V semiconductors such as GaAs. The inventive method can produce compound semiconductor material of high crystalline quality but exhibiting relatively short carrier lifetimes (e.g., less than about 100 ps). Such material can advantageously be used to produce very fast opto-electronic devices, e.g., photodetectors.

EXAMPLE 1

A relatively thick Si layer was grown as follows. On a Si(100) substrate a standard "Shiraki" cleaning procedure was performed followed by desorption of the oxide in an MBE growth chamber. An undoped Si buffer layer was then grown under conventional MBE conditions to establish a clean, flat Si surface. After cooling to 280° C. a 25 nm thick epitaxial Si layer was deposited at a rate of 0.1 nm/sec. After completion of the deposition the temperature was raised rapidly (within less than 60 s) to 550° C. and maintained at that level for 30 s, followed by a relatively rapid (within less than 60 s) cool to 280° C. This was followed by deposition of a further 25 nm Si layer as described above, and heat treatment, also as described. This procedure was repeated until an epitaxial film of thickness 100 nm was produced. As can be seen from FIG. 1, this thickness exceeds $h_{epi}$ for 280° C. The resulting layer was of device quality, with less than $10^7$ dislocation/cm².

EXAMPLE 2

A relatively thick, heavily doped Si layer is grown substantially as described above, except that the substrate surface is exposed to a flux of Si and Sb, with the Si and Sb flux being respectively, $1.03 \cdot 10^{14}$ atom/cm²·s and $9.62 \times 10^{10}$ atoms/cm²·s. The resulting layer has a dopant concentration of $4.66 \cdot 10^{19} cm^{-3}$, with essentially all (more than 90%) of the dopant atoms activated at room temperature.

EXAMPLE 3

A relatively thick GaAs layer is grown substantially as described above, except that the substrate is GaAs (100), the cleaning and oxide desorption are standard but differ from that of Example 1, the buffer layer is conventionally grown GaAs, $T_s$ is 230° C., the thickness of individual GaAs layer is 400 nm, the temperature is ramped to, and maintained for 30 s at, 600° C., and the final layer thickness is about 1.2 $\mu$m.

EXAMPLE 4

A relatively thin, highly doped Si layer with a relatively thick, lightly doped Si cap layer thereon was grown as follows: cleaning, desorption, and growth of a Si buffer layer were performed as described in Example 1. The thus prepared substrate was cooled to 230° C., and a 10 nm In-doped ($2 \times 10^{19} cm^{-3}$) Si layer deposited at 0.1 nm/s. After 100 s at the indicated conditions the In flux is terminated and a Sb flux initiated, with the flux adjusted to result in a Sb concentration of $10^{17} cm^{-3}$. After growth of 3 nm of Sb-doped Si at 230° C., the substrate temperature was raised to 550° C. and the deposition continued until a 500 nm thick Sb-doped Si layer was produced. Those skilled in the art will appreciate that the low temperature deposition of a portion of the cap layer serves to suppress dopant segregation out of the heavily doped layer. Those skilled in the art will also recognize that the above described procedure can be part of, together with conventional steps such as photolithography, etching, metallization etc., a method of producing semiconductor devices, e.g., heterojunction bipolar transistors, or integrated circuits that comprise such devices.

We claim:

1. A method of making an article comprising a semiconductor device, the method comprising
    a) providing a single crystal semiconductor body having a major surface;
    b) maintaining the body in an evacuated space at a given temperature $T_s$ and exposing the major surface to a stream of at least one atomic or molecular species such that a single crystal epitaxial semiconductor layer is formed on at least a part of the surface; and
    c) carrying out one or more further steps towards completion of the article; characterized in that
    d) $T_s$ is less than 400° C.; step b) comprises
    i) forming a first single crystal semiconductor layer of thickness less than or equal to a thickness $h_{epi}$ that is associated with the given $T_s$; and the method further comprises
    ii) subjecting, without exposure to the ambient atmosphere, the body with the first single crystal semiconductor layer thereon to a rapid thermal anneal (RTA), the temperature $T_a$ and time $t_a$ of the RTA as well as the heating and cooling rates associated with the RTA selected such that essentially no bulk diffusion and/or strain relaxation occurs, and such that significant surface diffusion occurs; and
    iii) forming, at a temperature less than 400° C., on the first single crystal semiconductor layer at least a second single layer crystal semiconductor layer of thickness less than or equal to $h_{epi}$.

2. Method of claim 1, wherein step iii) is carried out at substantially the same temperature $T_s$ as step i), with the thickness $h_{epi}$ of step iii) being substantially the same as $h_{epi}$ of step i).

3. Method of claim 1, wherein $T_a$ is greater than 450° C., $t_a$ is less than 60 seconds, and the heating and cooling rates are such that the transition between $T_s$ and $T_a$ is substantially completed in at most 60 seconds.

4. Method of claim 1, wherein the single crystal semiconductor layer comprises material selected from the group consisting of Si and the III-V compound semiconductors.

5. A method of making a semiconductor device, the method comprising
   a) providing a single crystal Si body having a major surface;
   b) maintaining the body at a given temperature $T_s$ and exposing the major surface to a stream of particles that comprises Si such that a first single crystal epitaxial Si layer is formed on at least a part of the surface; and
   c) carrying out one or more further steps towards completion of the device; Characterized in that
   d) $T_s$ is less than 350° C.; and the thickness of the first layer is less than or equal to a thickness $h_{epi}$ associated with the given $T_s$; and
   e) the stream of particles comprises, at least at some time during step b), dopant particles selected from the group consisting of Sb, Ga, In, B, As and P, with the ratio of Si to dopant selected such that the resultant maximum dopant concentration is at least $10^{19} cm^{-3}$, with at least 90% of the dopant atoms in the layer being electrically active at 20° C.

6. Method of claim 5, wherein step c) comprises depositing on the first Si layer a second single crystal epitaxial Si layer that differs from the first layer in conductivity type and/or dopant concentration.

7. Method of claim 6, wherein at least part of the second layer is deposited at $T_s \gtrsim 450°$ C.

8. Method of claim 5, further comprising subjecting the body with the first layer thereon to a rapid thermal anneal (RTA), the temperature $T_a$ and time $T_a$ of the RTA as well as the heating and cooling rates associated with the RTA selected such that essentially no bulk diffusion and/or strain relaxation occurs, and such that significant surface diffusion occurs; and depositing a further single crystal epitaxial Si layer, doped or not intentionally doped, onto the first layer.

* * * * *